United States Patent
Okamoto et al.

(10) Patent No.: US 9,502,551 B2
(45) Date of Patent: Nov. 22, 2016

(54) NITRIDE SEMICONDUCTOR TRANSISTOR DEVICE

(71) Applicant: Renesas Electronics Corporation, Tokyo (JP)

(72) Inventors: Yasuhiro Okamoto, Tokyo (JP); Tatsuo Nakayama, Tokyo (JP); Takashi Inoue, Tokyo (JP); Hironobu Miyamoto, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/829,216

(22) Filed: Aug. 18, 2015

(65) Prior Publication Data

US 2016/0005846 A1    Jan. 7, 2016

Related U.S. Application Data

(63) Continuation of application No. 13/548,078, filed on Jul. 12, 2012, now Pat. No. 9,123,739.

(30) Foreign Application Priority Data

Aug. 8, 2011 (JP) ................................. 2011-173020

(51) Int. Cl.
*H01L 29/778* (2006.01)
*H01L 29/20* (2006.01)
(Continued)

(52) U.S. Cl.
CPC ....... *H01L 29/7787* (2013.01); *H01L 29/2003* (2013.01); *H01L 29/205* (2013.01); *H01L 29/4236* (2013.01); *H01L 29/66462* (2013.01); *H01L 29/7786* (2013.01)

(58) Field of Classification Search
CPC ........... H01L 29/4236; H01L 29/2003; H01L 29/7787; H01L 29/66462
See application file for complete search history.

(56) References Cited

U.S. PATENT DOCUMENTS 7,038,253 B2    5/2006  Yoshida et al.
7,700,973 B2 *  4/2010  Shen .................. H01L 29/7787
                                                          257/194

(Continued)

FOREIGN PATENT DOCUMENTS

CN    101390201 A    3/2009
JP    2010-45073 A   2/2010

(Continued)

OTHER PUBLICATIONS

Japanese Office Action dated Feb. 17, 2015 with English Translation.

(Continued)

*Primary Examiner* — Jerome Jackson, Jr.
*Assistant Examiner* — Paul Budd
(74) *Attorney, Agent, or Firm* — McGinn IP Law Group, PPLC

(57) ABSTRACT

A semiconductor device includes a first semiconductor layer, a second semiconductor layer formed over the first semiconductor layer, a gate insulating film contacting the second semiconductor layer, and a gate electrode facing the second semiconductor layer via the gate insulating film. The first semiconductor layer includes an $Al_x\alpha_{1-x}N$ layer ($\alpha$ includes Ga or In, and $0<x<1$), and the second semiconductor layer includes an $Al_y\alpha_{1-y}N$ layer ($0\le y<1$), in which y of the $Al_y\alpha_{1-y}N$ layer forming the second semiconductor layer increases at least in a region under the gate electrode as a position where y is measured approaches the first semiconductor layer.

14 Claims, 7 Drawing Sheets

(51) Int. Cl.
 *H01L 29/423* (2006.01)
 *H01L 29/66* (2006.01)
 *H01L 29/205* (2006.01)

(56) References Cited

U.S. PATENT DOCUMENTS

| | | | |
|---|---|---|---|
| 8,487,346 | B2 | 7/2013 | Sato |
| 8,853,666 | B2 | 10/2014 | Inoue et al. |
| 2001/0040247 | A1 | 11/2001 | Ando et al. |
| 2005/0082568 | A1 | 4/2005 | Hirose et al. |
| 2009/0065810 | A1* | 3/2009 | Honea ................ H01L 27/0605 257/192 |
| 2010/0012977 | A1* | 1/2010 | Derluyn .............. H01L 29/2003 257/194 |
| 2010/0210080 | A1 | 8/2010 | Nomura et al. |
| 2011/0006346 | A1 | 1/2011 | Ando et al. |
| 2011/0073911 | A1* | 3/2011 | Sato ..................... H01L 29/107 257/194 |
| 2011/0210377 | A1 | 9/2011 | Haeberlen et al. |
| 2011/0263102 | A1 | 10/2011 | Heikman et al. |

FOREIGN PATENT DOCUMENTS

| | | |
|---|---|---|
| JP | 2010-219151 A | 9/2010 |
| JP | 2011-044647 A | 3/2011 |
| JP | 2011-71356 A | 4/2011 |
| WO | WO 03/071607 A1 | 8/2003 |
| WO | WO 2007-077666 A1 | 7/2007 |

OTHER PUBLICATIONS

Chinese Office Action dated Mar. 23, 2015 with English Translation.
U.S. Office Action dated Nov. 17, 2014 in U.S. Appl. No. 13/548,078.
U.S. Notice of Allowance dated Apr. 30, 2015 in U.S. Appl. No. 13/548,078.
Japanese Office Action, dated Aug. 2, 2016, and an English Translation.

\* cited by examiner

NITRIDE SEMICONDUCTOR TRANSISTOR DEVICE

The present application is a Continuation application of U.S. patent application Ser. No. 13/548,078, filed on Jul. 12, 2012, which is based on and claims priority from Japanese patent application No. 2011-173020 filed on Aug. 8, 2011, the entire contents of which are incorporated herein by reference.

BACKGROUND

The present invention relates to semiconductor devices including nitride semiconductor layers and methods for manufacturing the semiconductor devices.

Field-effect transistors including nitride semiconductor layers such as GaN layers are expected to be widely used as electric power control elements because they have high withstand voltages and low resistivities. It is required that these electric power control elements are normally-off type elements. However, it is difficult to make field-effect transistors including nitride semiconductor layers normally-off type transistors.

International Publication WO 03/071607 discloses a transistor that uses two-dimensional electron gas accumulated at the interface, that is, at the hetero junction between an AlGaN layer and a GaN layer as carriers. This transistor is configured in a way that there is no hetero junction under the gate electrode of the transistor to prevent the two-dimensional electron gas from generating under the gate electrode. International Publication WO 03/074607 states that a normally-off transistor can be realized with the use of this configuration.

Japanese Unexamined Patent Application Publication No. 2011-044647 discloses a transistor that has a configuration that is formed as follows. First, a first nitride semiconductor layer, a second nitride semiconductor layer, and a third nitride semiconductor layer are stacked, and two-dimensional electron gas is generated at the interface between the second and third nitride semiconductor layers. Next, a concave portion, which reaches the first nitride semiconductor layer, is formed in the third nitride semiconductor layer and the second nitride semiconductor layer, and a gate insulating film and a gate electrode are embedded in this concave portion. In Japanese Unexamined Patent Application Publication No. 2011-044647, the concave portion penetrates the second nitride semiconductor layer. In addition, Japanese Unexamined Patent Application Publication No. 2011-044647 discloses that the second nitride semiconductor layer is formed by stacking plural AlGaN layers each of which has an Al concentration different from each other.

SUMMARY

It is also required that electric power control transistors have high threshold voltages. However, it has been said that it is difficult to make the threshold voltage of a transistor having a channel made of a nitride semiconductor layer high.

According to an aspect of the present invention, provided is a semiconductor device that include: a first nitride semiconductor layer; a second nitride semiconductor layer formed over the first nitride semiconductor layer; a gate insulating film contacting the second nitride semiconductor layer; and a gate electrode facing the second nitride semiconductor layer via the gate insulating film, in which the second nitride semiconductor layer is formed by stacking plural semiconductor layers, and the semiconductor layers are polarized in the same direction at least in the region under the gate electrode, and have compositions different from each other, with the result that the amount of negative charge is larger than that of positive charge at each interface between two semiconductor layers.

According to the above-described aspect of the present invention, the second nitride semiconductor layer is formed by stacking plural semiconductor layers. These semiconductor layers are polarized in such a direction so that the amount of negative charge becomes larger than that of positive charge at each interface between two semiconductor layers at least in the region under the gate electrode. In other words, it can be said in appearance that there is negative charge in advance in the region where a channel is formed in the second nitride semiconductor layer. Therefore, a transistor formed in such a way has a high threshold voltage.

According to another aspect of the present invention, provided is a semiconductor device that includes a first nitride semiconductor layer formed by an $Al_x\alpha_{1-x}N$ layer ($\alpha$ is Ga or In, and $0<x<1$); a second nitride semiconductor layer formed over the first nitride semiconductor layer and formed by an $Al_y\alpha_{1-y}N$ layer ($0 \leq y<1$); a gate insulating film contacting the second nitride semiconductor layer; and a gate electrode facing the second nitride semiconductor layer via the gate insulating film, is provided. In addition, the semiconductor device has a feature that y of the $Al_y\alpha_{1-y}N$ layer forming the second nitride semiconductor layer increases at least in the region under the gate electrode as a position where y is measured approaches the first nitride semiconductor layer.

According to the above-described aspect of the present invention, the second nitride semiconductor layer are formed by the $Al_y\alpha_{1-y}N$ layer ($0 \leq y<1$). In addition, y increases as a position where y is measured approaches the first nitride semiconductor layer. Therefore, it can be said in appearance that there is negative charge in advance in the region where a channel is formed in the second nitride semiconductor layer, with the result that a transistor formed in such a way has a high threshold voltage.

According to another aspect of the present invention, provided is a method of manufacturing a semiconductor device including the steps of: forming a second nitride semiconductor layer over a first nitride semiconductor layer; forming a gate insulating film contacting the second nitride semiconductor layer; and forming a gate electrode facing the second nitride semiconductor layer via the gate insulating film, wherein, in the step of forming the second nitride semiconductor layer. In addition, in this method, the second nitride semiconductor layer is formed by stacking plural semiconductor layers having compositions different from each other, and the semiconductor layers are polarized in the same direction and have compositions different from each other at least in the region under the gate electrode, with the result that the intensity of the polarization of the second nitride semiconductor layer becomes higher or lower as a position where the intensity of the polarization is measured approaches the gate electrode, and the semiconductor layers are polarized with an inclination so that, at each interface between two semiconductor layers, the amount of negative charge becomes larger than that of positive charge.

According to another aspect of the present invention, provided is a method of manufacturing a semiconductor device including the steps of: forming a second nitride semiconductor layer formed by an $Al_y\alpha_{1-y}N$ layer ($0 \leq y<1$) over a first nitride semiconductor layer formed by an $Al_x\alpha_{1-x}N$ layer ($\alpha$ is Ga or In, and $0<x<1$); forming a gate insulating film contacting the second nitride semiconductor layer; and forming a gate electrode facing the second nitride semiconductor layer via the gate insulating film. In addition, in the step of forming the second nitride semiconductor layer, the second nitride semiconductor layer is formed so that y of the $Al_y\alpha_{1-y}N$ layers forming the second nitride semiconductor layer becomes larger as a position where y is measured approaches the first nitride semiconductor layer.

According to aspects of the present invention, a transistor employing a nitride semiconductor layer as a channel can have a high threshold voltage.

DETAILED DESCRIPTION

Figure 1:
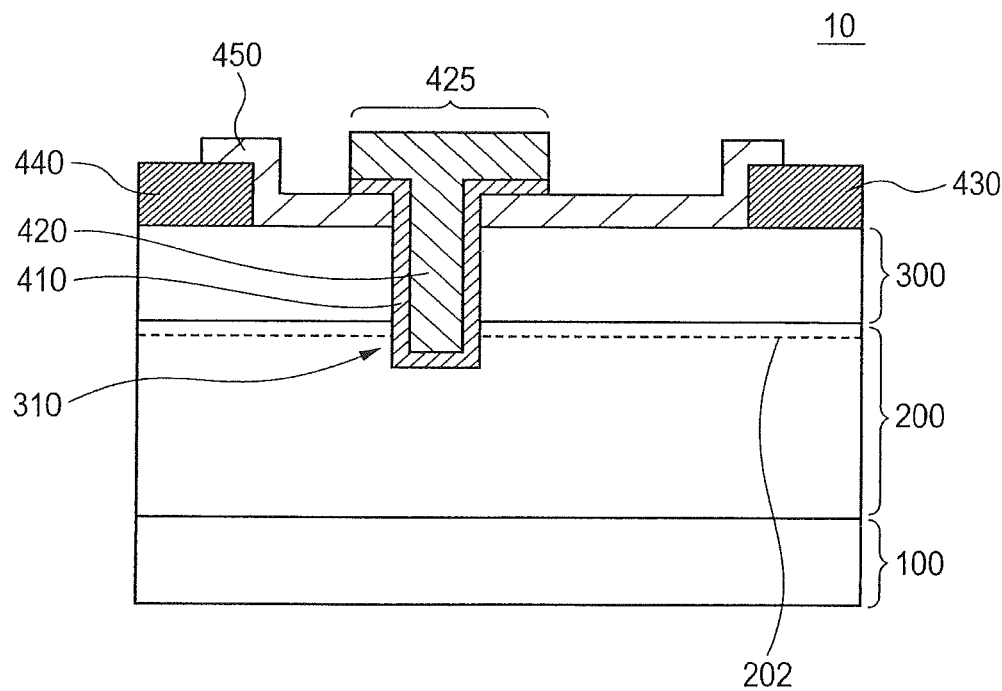
FIG. 1 is a cross-section view showing the structure of a semiconductor device according to a first embodiment.

Embodiments of the present invention will be described with reference to the attaching drawings hereinafter. In all the attaching drawings, members having identical functions are denoted by identical reference numerals and signs and repeated explanation of the members is omitted.

First Embodiment

FIG. 1 is a cross-section view showing the structure of a semiconductor device according to a first embodiment. This semiconductor device includes a field-effect transistor 10. This semiconductor device includes a first nitride semiconductor layer 100, a second nitride semiconductor layer 200, a third nitride semiconductor layer 300, a gate insulating film 410, and a gate electrode 420. The second nitride semiconductor layer 200 is a channel layer of the field-effect transistor 10. In this embodiment, because the field-effect transistor 10 uses two-dimensional electron gas 202 generated at the interface between the second nitride semiconductor layer 200 and the third nitride semiconductor layer 300, the field-effect transistor 10 has a low resistivity.

The first nitride semiconductor layer 100 functions as a buffer layer in which the second nitride semiconductor layer 200 is epitaxially grown. The first nitride semiconductor layer 100 is, for example, an $Al_xGa_{1-x}N$ layer ($0<x<1$), or an $Al_xIn_{1-x}N$ layer ($0<x<1$). The film thickness of the first nitride semiconductor layer 100 is, for example, larger than 1 $\mu m$, and it can be larger than 3 $\mu m$. By making the film thickness of the first nitride semiconductor layer 100 thicker, the withstand voltage of the field-effect transistor 10 can be made higher. For example, if the film thickness of the first nitride semiconductor layer 100 is 3 $\mu m$, the withstand voltage of the field-effect transistor 10 can be larger than 500 volts.

The second nitride semiconductor layer 200 functions as a channel layer. Therefore, the gate insulating film 410 contacts the second nitride semiconductor layer 200. The second nitride semiconductor layer 200 is, for example, an $Al_yGa_{1-y}N$ layer ($0.\leq y<1$) if the first nitride semiconductor layer 100 is an $Al_xGa_{1-x}N$ layer, and an $Al_yIn_{1-y}N$ layer ($0.\leq y<1$) if the first nitride semiconductor layer 100 is an $Al_xIn_{1-x}N$ layer.

The film thickness of the second nitride semiconductor layer 200 is, for example, larger than 10 nm and smaller than 10 $\mu m$. By making the film thickness of the second nitride semiconductor layer 200 thicker, the withstand voltage of the field-effect transistor 10 can also be higher. For example, if the film thickness of the first nitride semiconductor layer 100 is 1 $\mu m$ and the film thickness of the second nitride semiconductor layer 200 is 2 $\mu m$, the withstand voltage of the field-effect transistor 10 can also be made larger than 500 volts.

The third nitride semiconductor layer 300 is epitaxially grown over the second nitride semiconductor layer 200. The third nitride semiconductor layer 300 functions as an electron supply layer, and is prepared for generating two-dimensional electron gas 202 in the second nitride semiconductor layer 200. In order to generate the two-dimensional electron gas 202, it is necessary that there is a conduction band discontinuity at the interface between the second nitride semiconductor layer 200 and the third nitride semiconductor layer 300. In other words, it is necessary that the third nitride semiconductor layer 300 has a lower electron affinity than the second nitride semiconductor layer 300 has at interface between the second nitride semiconductor layer 200 and the third nitride semiconductor layer 300, For example, if the second nitride semiconductor layer 200 is formed by an $Al_yGa_{1-y}N$ layer 200, the third nitride semiconductor layer 300 is formed by an $Al_zGa_{1-z}N$ layer ($0.\leq z<1$), and if the second nitride semiconductor layer 200 is formed by an $Al_yIn_{1-y}N$ layer, the third nitride semiconductor layer 300 is formed by an $Al_zIn_{1-z}N$ layer ($0.\leq z<1$).

In addition, at the interface between the second nitride semiconductor layer 200 and the third nitride semiconductor layer 300, there is a relationship "z>y" between z of the $Al_z\alpha_{1-z}N$ layer forming the third nitride semiconductor layer 300 and y of the $Al_y\alpha_{1-y}N$ layer forming the second nitride semiconductor layer 200. The reason why the Al composition ratio of the third nitride semiconductor layer 300 is set larger than that of the second nitride semiconductor layer 200 is because a conduction band discontinuity is formed between the second nitride semiconductor layer 200 and the third nitride semiconductor layer 300 owing to the difference between these Al composition ratios, and hence the two-dimensional electron gas 202 is generated. At this interface, it is preferable that $z>y+0.05$, and it is more preferable that $z>y+0.10$. If the relationship between y and z is set as above, the two-dimensional electron gas 202 with an adequate concentration is generated at the interface between the second nitride semiconductor layer 200 and the third nitride semiconductor layer 300.

A concave portion 310 is formed in the third nitride semiconductor layer 300. The gate insulating film 410 is formed on the inner wall and the bottom of the concave portion 310. The gate insulating film 410 can be made of, for example, oxide silicon ($SiO_2$), but can be made of other materials—such as alumina ($Al_{20}O_3$), hafnium oxide ($HfO_2$), silicon nitride (SiN), or aluminum nitride (AlN). The thickness of the gate insulating film 410 is, for example, larger than 30 nm, but preferably it is larger than 50 nm, and more preferably larger than 70 nm. If the gate insulating film 410 is made thicker, the gate withstand voltage of the field-effect transistor 10 becomes higher. Specifically, if the thickness of the gate insulating film 410 is made 70 nm or larger, the long-term reliability of the field-effect transistor 10 is greatly improved.

The empty space in the concave portion 310 where the gate insulating film 410 is not formed is embedded with a gate electrode 420. In other words, the gate electrode 420 faces the second nitride semiconductor layer 200 via the gate insulating film 410. The gate electrode 420 can be made of, for example, Au, but it can also be made of a metal monolayer film such as a Ni or Pt film, a multilayer film formed by stacking an Ni layer and an Au layer, a metal multilayer film formed by stacking plural metals other than Ni and Au, a metal compound film formed by WSi or TiN, or a film formed by a semiconductor material such as polysilicon.

In this embodiment, the upper parts of the gate insulating film 410 and the gate electrode 420 form a protruding portion 425. The protruding portion 425 is a portion that protrudes from the concave portion 310 and extends over the third nitride semiconductor layer 300 that surrounds the concave portion 310. In this embodiment, an electric field is concentrated to the corners of the bottom of the concave portion 310 of the gate insulating film 410. However, the protruding portion 425 is prepared, so that the electric field is also concentrated to the end parts of the protruding portion 425. As a result, the concentration of the electric field to the corners of the bottom of the concave portion 310 of the gate insulating film 410 is alleviated, and the withstand voltage of the field-effect transistor 10 is improved.

The lower end of the concave portion 310 reaches the second nitride semiconductor layer 200, but does not reach the first nitride semiconductor layer 100. In an example shown in FIG. 1, the lower end of the concave portion 310 extends into the inside of the second nitride semiconductor layer 200. Therefore, the two-dimensional electron gas 202 is divided into two by the concave portion 310. As a result, the field-effect transistor 10 becomes a normally-off type transistor.

In this embodiment, the content of Al (Al composition ratio) of the second nitride semiconductor layer 200 increases at least in the region under the gate electrode 420 (that is y increases) as a position where y is measured approaches the first nitride semiconductor layer 100. In other words, the Al composition ratio of the second nitride semiconductor layer 200 is aslant in its thickness direction. Here, it is conceivable that the Al composition ratio continuously changes or that the Al composition ratio discontinuously (or stepwise) changes as seen in the case where the second nitride semiconductor layer 200 is formed by stacking plural nitride semiconductor layers with Al composition ratios different from each other. For example, if the second nitride semiconductor layer 200 has a structure formed by plural nitride semiconductor layers 204 with Al composition ratios different from each other stacked one-by-one (shown in FIG. 2), the Al composition ratio of the second nitride semiconductor layer 200 is aslant. Here, it will be assumed that a nitride semiconductor layer 204 includes a monolayer or monolayers. If one nitride semiconductor layer 204 has a structure formed by plural monatomic layers, the Al composition of the second nitride semiconductor layer 200 changes stepwise.

As described above, the plural semiconductor layers forming the second nitride semiconductor layer 200 are polarized in the same direction. In addition, at the interfaces between the semiconductor layers, the amount of negative charge is larger than that of positive charge. As a result, the threshold voltage of the field-effect transistor 10 becomes higher. The reason why the threshold voltage becomes higher will be described later with reference to FIG. 2, FIG. 3, and FIG. 4. It is all right that the intensity of the polarization of a semiconductor layer nearer to the gate electrode 420 is higher (or lower) than that of a semiconductor layer far from the gate electrode 420. In addition, it is all right that the intensities of polarization of the semiconductor layers much more change in one direction as the positions of the semiconductor layers become nearer to the gate electrode 420.

In order to make the threshold voltage of the field-effect transistor 10 larger, assuming that y at the interface between the first nitride semiconductor layer 100 and the second nitride semiconductor layer 200 is $y_1$, and y at the surface of the second nitride semiconductor layer 200 (that is, at the interface between the second nitride semiconductor layer 200 and the third nitride semiconductor layer 300) is $y_2$, it is preferable that $0.05<y_1-y_2<0.12$.

A drain electrode 430 and a source electrode 440 are formed over the third nitride semiconductor layer 300. The drain electrode 430 and the source electrode 440 form ohmic contacts with the third nitride semiconductor layer 300 respectively. The drain electrode 430 and the source electrode 440 are made of, for example, stacked films that are formed by stacking Al on Ti. In the example shown in FIG. 1, in order to make the drain withstand voltage high, the distance from the drain electrode 430 to the gate electrode 420 is set longer than the distance from the source electrode 440 to the gate electrode 420.

Part of the upper surface of the third nitride semiconductor layer 300 where neither the drain electrode 430 nor the source electrode 440 is formed is covered with a protective insulating film 450. The protective insulating film is, for example, a SiN film. The protruding portion 425 of the gate insulating film 410 and the gate electrode 420 is formed over the protective insulating film 450. Part of the drain electrode 430 and part of the source electrode 440 that are near to the protruding portion 425 are also covered with the protective insulating film 450.

Figure 2:
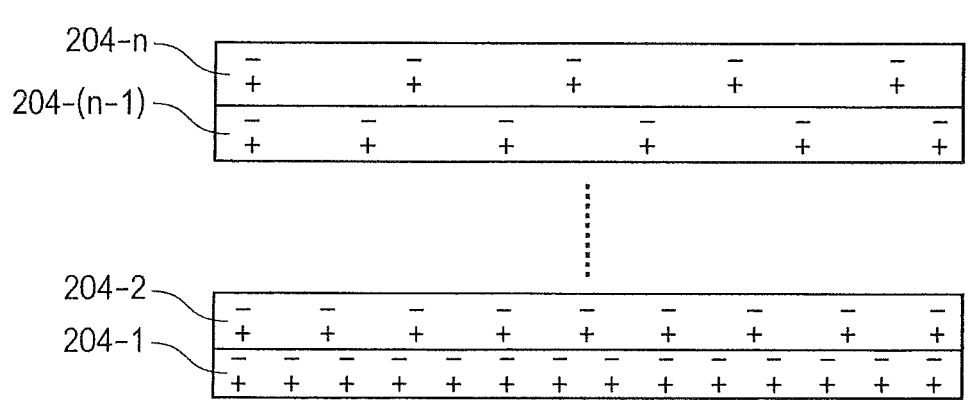
FIG. 2 is a schematic diagram for explaining the structure of a second nitride semiconductor layer.

FIG. 2 is a schematic diagram for explaining the configuration of the second nitride semiconductor layer 200. As described above, the second nitride semiconductor layer 200 has a structure formed by stacking plural nitride semiconductor layers 204. The nitride semiconductor layers 204 each are polarized in their thickness direction. In an example shown in FIG. 2, the nitride semiconductor layers 204 each are polarized so that the bottom surfaces of the nitride semiconductor layers 204 are charged positively. This example shows that the higher the position of a nitride semiconductor layer 204 is, the weaker the intensity of polarization of the nitride semiconductor layer 204 becomes. Here, the strength of polarization indicates the amount of polarized charge at each of the nitride semiconductor layers 204. In other words, the amount of polarized charge, which each of the nitride semiconductor layers 204 (204-1 to 204-$n$) has, has a tendency to decrease as the position of the layer becomes higher (that is, as the layer approaches the gate electrode 420). Therefore, at the interface between two nitride semiconductor layers 204, the strength of negative charge at the top surface of the lower nitride semiconductor layer 204 is larger than the strength of positive charge at the bottom surface of the upper nitride semiconductor layer 204. In other words, at the interface between two layers adjacent to each other of the nitride semiconductor layers 204 (assuming that the upper layer is a semiconductor layer 204-$i$ and the lower layer is a semiconductor layer 204-($i$−1), where 2.ltoreq.i.ltoreq.n), the amount of polarized charge in the semiconductor layer 204-($i$−1) is larger than that of polarized charge in the semiconductor layer 204-$i$. In addition, positively-polarized charge is generated at the bottom surface of an upper semiconductor layer that contacts a lower semiconductor layer having a higher Al composition ratio, and negatively-polarized charge is generated at the top surface of a lower semiconductor layer that contacts an upper semiconductor layer having a lower Al composition ratio. In other words, in the vicinity of the interface between two adjacent layers (that is, a lower layer and an upper layer), negatively-polarized charge is generated in the lower layer and positively-polarized charge is generated in the upper layer. Therefore, in the vicinity of each interface, the amount of negative charge is larger than that of positive charge. As a result, it can be said in appearance that there is negative charge at the interfaces between the nitride semiconductor layers 204. As a material of which the second nitride semiconductor layer 200 is made, nitride semiconductors including Al can be used, and for example, AlGaN, AlInN, and AlGaInN can be cited. The above description has been made under the assumption that the polarization is made in such a way that the bottom surface of a nitride semiconductor layers 204 is negatively charged and the top surface is positively charged. In the case where the direction of polarization is opposite to the above case, things go all right if the composition ratios of the nitride semiconductor layers 204 and the like are changed so that the amount of polarized charge, which each layer of the nitride semiconductor layers 204 has, has a tendency to increase as the position of the layer becomes higher. Even in this case, because it can be said in appearance that there is negative charge at the interfaces between the nitride semiconductor layers 204, the threshold voltage can be made high.

Figure 3:
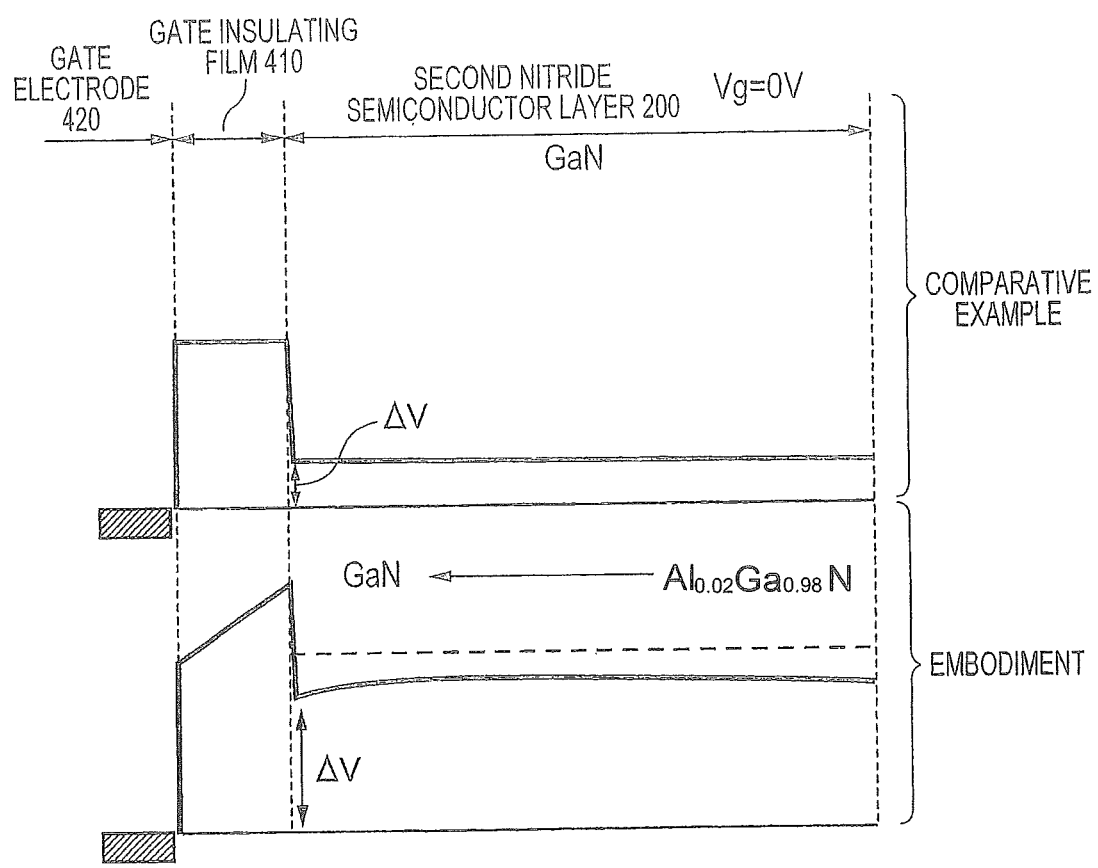
FIG. 3 is a diagram showing a simulation result of the potential of the conduction band of the second nitride semiconductor layer having a structure according to the embodiment and a simulation result of the potential of the conduction band of the second nitride semiconductor layer having a structure formed by a single layer of GaN (a comparative example)

FIG. 3 is a diagram showing a simulation result of the potential of the conduction band of the second nitride semiconductor layer 200 having a structure according to the embodiment and a simulation result of the potential of the conduction band of the second nitride semiconductor layer having a structure formed by a single layer of GaN (a comparative example). FIG. 3 is a diagram showing potentials of the conduction bands regarding this embodiment and the comparative example at the cross-section view taken along the vertical line that passes through the center of the gate electrode 420 in FIG. 1. In FIG. 3, it is assumed that the voltage Vg of the gate electrode 420 is 0 volt.

In this simulation, the structure of the embodiment is as follows. The Al composition ratio z of the third nitride semiconductor layer 300 is set to be 0.2. In addition, the Al composition ratio y of the second nitride semiconductor layer 200 is set to be 0 at the interface between the second nitride semiconductor layer 200 and the third nitride semiconductor layer 300, and set to be 0.02 at the interface between the first nitride semiconductor layer 100 and the second nitride semiconductor layer 200. In addition, the Al composition ratio x in the first nitride semiconductor layer 100 is set to be 0.02. Furthermore, the thickness of the first nitride semiconductor layer 100 is set to be 1 .mu.m, the thickness of the second nitride semiconductor layer 200 is set to be 100 nm, and the thickness of the third nitride semiconductor layer 300 is set to be 30 nm. In addition, an SiO.sub.2 film whose thickness is 30 nm is used as the gate insulating film 410.

The structure of the comparative example is the same as that of the embodiment except for the following points. First, the first nitride semiconductor 100 is not prepared. Secondly, the second nitride semiconductor layer 200 is formed by a GaN film whose thickness is 1 .mu.m. In addition, the Al composition ratio z of the third nitride semiconductor layer 300 is set to be 0.15, and the thickness of the third nitride semiconductor layer 300 is set to be 45 nm.

The threshold voltage of the field-effect transistor 10 is determined by the difference (.DELTA.V) between the potential of the conduction band and the Fermi level at the interface between the gate insulating film 410 and the second nitride semiconductor layer 200. In the comparative example, because any electric field is not applied to the gate insulating film 410 under the condition that any gate voltage is not applied, the potential of the conduction band is almost flat, and .DELTA.V is about 1 eV.

On the other hand, in the structure of the embodiment, by changing the Al composition ratio in the direction of the thickness of the second nitride semiconductor layer 200, negative charge generated from polarization is distributed in the second nitride semiconductor layer 200. Therefore, an electric field corresponding to the negative charge distributed in the second nitride semiconductor layer 200 is applied to the gate insulating film 410, hence the potential of the conduction band at the interface between the gate insulating film 410 and the second nitride semiconductor layer 200 is raised upwards. As a result, .DELTA.V in this embodiment gets larger than that in the comparative example. In other words, the threshold voltage of the field-effect transistor 10 becomes high. .DELTA.V in this embodiment is about 2 eV.

In addition, in the structure of this embodiment, by changing the magnitude of the slant of the Al composition ratio of the second nitride semiconductor layer 200, the amount of negative charge distributed in the second nitride semiconductor layer 200 can be changed. Therefore, the threshold voltage of the field-effect transistor 10 can be controlled by controlling the magnitude of the slant of the Al composition ratio of the second nitride semiconductor layer 200.

Figure 4:
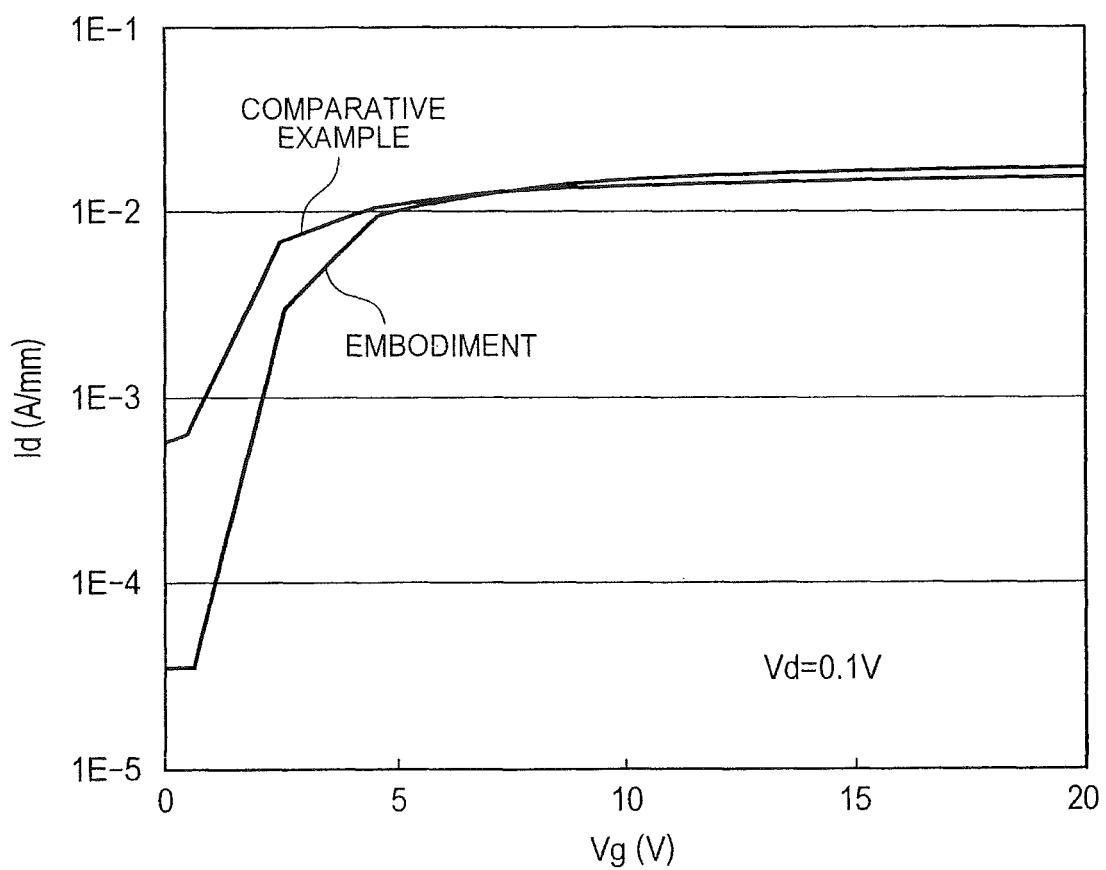
FIG. 4 is a diagram showing results obtained from a two-dimensional device simulation executed on the structures used in the simulation in FIG. 3.

FIG. 4 shows the result of a two-dimensional device simulation with the use of the structures that are used in the simulation whose result is shown in FIG. 3. Under the assumption that a gate voltage that causes a drain current to become 1 mA/mm is defined as a threshold voltage for this device simulation, the threshold voltage for the embodiment is 2.1 V while the threshold voltage for the comparison example is 0.7 V. This result also shows that, in the case where the second nitride semiconductor layer 200 has the structure according to the embodiment, the threshold voltage of the field-effect transistor 10 becomes high.

The grounds for the fact that the threshold voltage of the field-effect transistor 10 becomes high in the case where the second nitride semiconductor layer 200 has the structure according to the embodiment will be theoretically explained hereinafter.

It will be assumed that the Al composition ratio y of the second nitride semiconductor layer 200 changes in K steps from the lowermost portion to the uppermost portion of the second nitride semiconductor layer 200 (where K is an integer equal to 2 or larger). In addition, it will be assumed that $y_k$ is the Al composition ratio of the kth nitride semiconductor layer 204 of the nitride semiconductor layers 204 that form the second nitride semiconductor layer 200 (where k=0, 1, . . . , K). In addition, if a sufficiently large value is given to the value of K, the Al composition ratio x can be viewed as a continuously changing ratio.

A non-patent document (O. Ambacher, et al., "Pyroelectric properties of Al(In)GaN/GaN hetero- and quantum well structures", Journal of Physics C: Condensed Matter, Vol. 14, pp. 3399-3434 (2002)) discloses that spontaneous polarization charge $P_{SP}$ (unit: $C/m^2 = Cm^{-2}$) generated in an AlGaN layer that has an Al composition ratio $y_k$ is given by the next equation (1).

$$P_{SP}^{AlGaN}(y_k) = -0.090 y_k - 0.034 (1-y_k) + 0.021 y_k(-1-y_k) \quad [Cm^{-2}] \quad (1)$$

The distortion $\varepsilon_k$ of the kth AlGaN layer is defined by the next equation (2).

$$\varepsilon_k = a_0 - a_k a_k \quad (2)$$

In the equation (2), $a_0$ is the lattice constant of an AlGaN buffer layer, and $a_k$ is the lattice constant of the kth AlGaN layer that has an Al composition ratio $y_k$.

Because the Al composition ratio of the second nitride semiconductor layer 200 decreases as a position where the Al composition ratio is measured moves upward, the lattice constant increases as a position where the lattice constant is measured moves upward. Therefore, $\varepsilon_k < 0$. In this case, piezoelectric polarization charge $P_{PZ}$ (unit: $C/m^2 = Cm^{-2}$) generated in the nitride semiconductor layer 204 that forms the second nitride semiconductor layer 200 is given by the next equation (2B).

$$P_{PZ}^{AlGaN}(y_k) = -0.918 \varepsilon_k + 9.541 \varepsilon_k + 9 - 0.541 \alpha_k \varepsilon_k^2 - (0.89 \varepsilon_k + 3.915 \varepsilon_k^2) y_k [Cm^{-2}] \quad (2B)$$

In addition, polarization charge $P_{POL}$ in the nitride semiconductor layer 204 is given by the next equation (3).

$$P_{POL}^{AlGaN}(y_k) = P_{SP}^{AlGaN}(y_k) + P_{PZ}^{AlGaN}(y_k) \quad (3)$$

There is a difference between the polarization charge of the (k-1)th nitride semiconductor layer 204 and the polarization charge of the kth nitride semiconductor layer 204, and negative charge $\Delta\sigma_k$ corresponding to the difference exists at the interface between both layers. The negative charge $\Delta\sigma_k$ is given by the next equation (4).

$$\Delta\sigma_k = P_{POL}^{AlGaN}(y_k) - P_{POL}^{AlGaN}(y_{k-1}) \quad (4)$$

Assuming that the volume density of negative charge generated at the interface between the two nitride semiconductor layers 204 is represented by $N_{POL}$, and the thickness of the kth nitride semiconductor layer 204 is represented by $t_k$, the volume density $N_{POL}$ is given by the next equation (5).

$$N_{POL}(k) = \Delta\sigma_k t_k \quad (5)$$

In addition, the surface charge $Q_{ch}$ of the uppermost nitride semiconductor layer 204 is given by the equation (6).

$$Q_{ch} = k = 0 K \Delta\sigma_k \quad (6)$$

An electric field applied to the gate insulating film 410 is given by the equation (7).

$$E_{OX0} = Q_{ch} r 0 \quad (7)$$

where $\varepsilon_r$ is the relative permittivity of the gate insulating film 410, and $\varepsilon_0$ is the vacuum permittivity.

Assuming that the work function of the gate electrode 420 is represented by $\Phi_{GATE}$, the electron affinity of the upper most layer of the second nitride semiconductor layer 200 is represented by $\chi_{SEMI}$, and the thickness of the gate insulating film 410 is represented by $t_{OX}$, the difference $\Delta V$ between the potential of the conduction band and the Fermi level at the interface between the gate insulating film 410 and the second nitride semiconductor layer 200 can be approximated by the equation (8).

$$\Delta V = \Phi_{GATE} - \chi_{SEMI} + t_{OX} E_{OX0} \quad (8)$$

Concrete descriptions will be made with the use of the structures used in the simulations whose results are shown in FIG. 3 and FIG. 4. This time, 3.9, $8.85 \times 10^{-14}$ F/cm, 4.8 eV (Au), and 4.1 eV (GaN) are given to $\varepsilon_r$, $\varepsilon_0$, $\Phi_{GATE}$, and $\chi_{SEMI}$ respectively. As a result of using these values, $\Delta V = 0.70$ eV in the case of the comparative example, and $\Delta V = 1.75$ eV in the case of the embodiment. These values are almost equal to the resultant values of the simulation shown in FIG. 3 respectively.

Figure 5A:
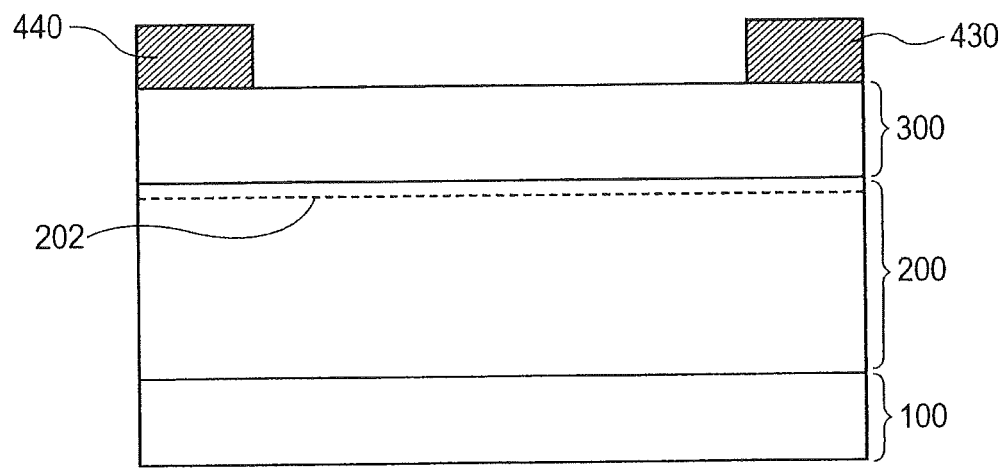
FIG. 5A and FIG. 5B are cross-section views used for explaining a method of manufacturing the semiconductor device whose cross-section is shown in FIG. 1.
Figure 5B:
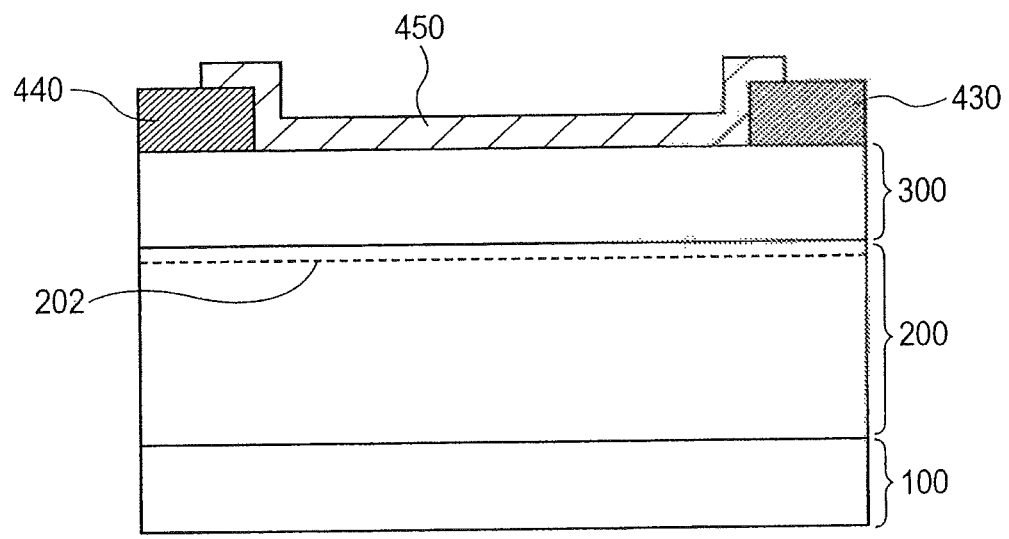
Figure 6:
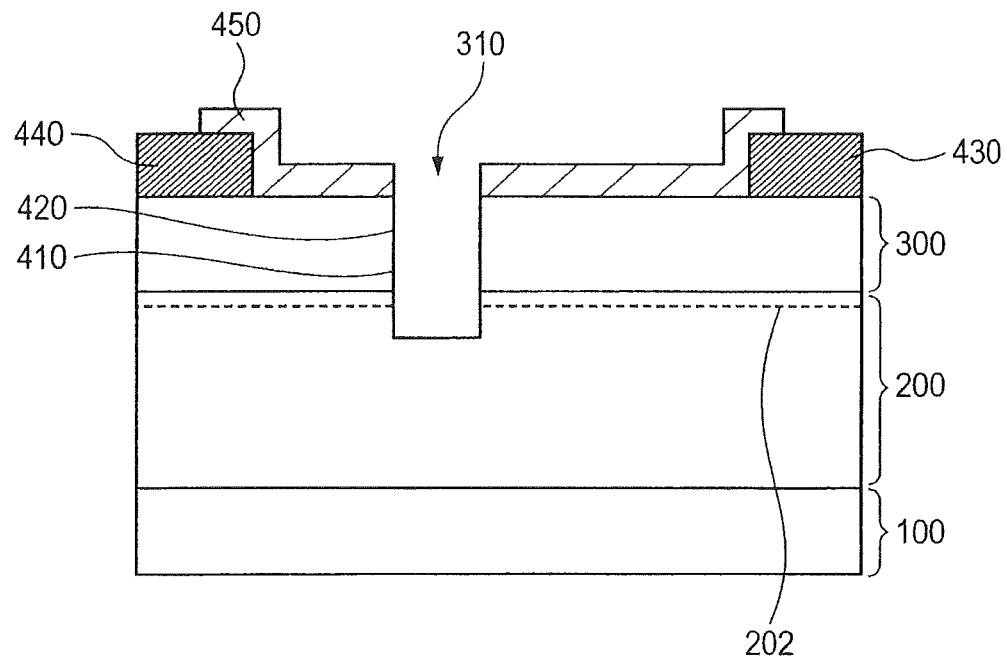
FIG. 6 is cross-section view used for explaining the method of manufacturing the semiconductor device whose cross-section is shown in FIG. 1.

FIG. 5A, FIG. 5B, and FIG. 6 are cross-section views used for explaining a method of manufacturing the semiconductor device the cross-section view of whose structure is shown in FIG. 1. First, as shown in FIG. 5A, the first nitride semiconductor layer 100, the second nitride semiconductor layer 200, and the third nitride semiconductor layer 300 are formed in this order on a substrate made of Si, sapphire, SiC or the like (not shown) with the use of an MOCVD method. Raw gas used for the MOCVD method is trimethyl gallium (TNG), trimethyl aluminum (TMA), or ammonia gas. In order to change the Al composition ratios of the first nitride semiconductor layer 100, the second nitride semiconductor layer 200, or the third nitride semiconductor layer 300, it is necessary to change the supply amount of trimethyl gallium while keeping constant the supply amounts of trimethyl aluminum and ammonia gas. For example, in order to gradually decrease the Al composition ratio of the second nitride semiconductor layer 200, it is necessary to gradually increase the supply amount of trimethyl gallium while keeping the supply amounts of trimethyl aluminum gas and ammonia gas constant.

Next, parts of the third nitride semiconductor layer 300 and the second nitride semiconductor layer 200 are removed to the extent that part of the first nitride semiconductor layer 100 is exposed in order to form a mesa and isolate elements.

Next, a metal film (for example, a film made of Ti and Al stacked in this order) is formed over the third nitride semiconductor layer 300 with the use of a sputtering technique, and then parts of this metal film are selectively removed. As a result, the drain electrode 430 and the source electrode 440 are formed over the third nitride semiconductor layer 300. Thereafter, an annealing process is carried out on the drain electrode 430 and the source electrode 440. As a result, the drain electrode 430 and the source electrode 440 form ohmic contacts with the third nitride semiconductor layer 300 respectively.

Next, as shown in FIG. 5B, the protective insulating film 450 is formed over the third nitride semiconductor layer 300, the drain electrode 430, and the source electrode 440 with the use of a plasma CVD method. Thereafter, parts of the protective insulating film 450 covering the drain electrode 430 and the source electrode 440 are removed.

Next, as shown in FIG. 6, part of the protective insulating film 450 covering the region where the concave portion 310 is to be formed is selectively removed. Thereafter, an etching process is carried out on part of the third nitride semiconductor layer 300 (and part of the second nitride semiconductor layer 200, as required) using the drain electrode 430, the source electrode 440, and the protective insulating film 450 as masks. After the etching process, the concave portion 310 is formed.

Next, the gate insulating film 410 is formed on the bottom and the lateral side of the concave portion 310, on the drain electrode 430, and on the source electrode 440 with the use of, for example, an ALD (atomic layer deposition) method. Thereafter, the gate electrode 420 is formed on the gate insulating film 410 with the use of, for example, a sputtering method. Next, unnecessary parts of the gate insulating film 410 and the gate electrode 420 are removed. As a result, the semiconductor device including the field-effect transistor 10 shown in FIG. 1 is formed.

As described above, according to this embodiment, each of the plural semiconductor layers forming the second nitride semiconductor layer 200 is polarized in the same direction. In addition, the intensity of the polarization of a semiconductor layer nearer to the gate electrode 420 is higher (or lower) than that of a semiconductor layer far from the gate electrode 420. The direction of this polarization is such a direction as to make the amount of negative charge larger than that of positive charge at each of plural interfaces between adjacent semiconductor layers. As a result, the threshold voltage of the field-effect transistor 10 becomes high.

Second Embodiment

Figure 7:
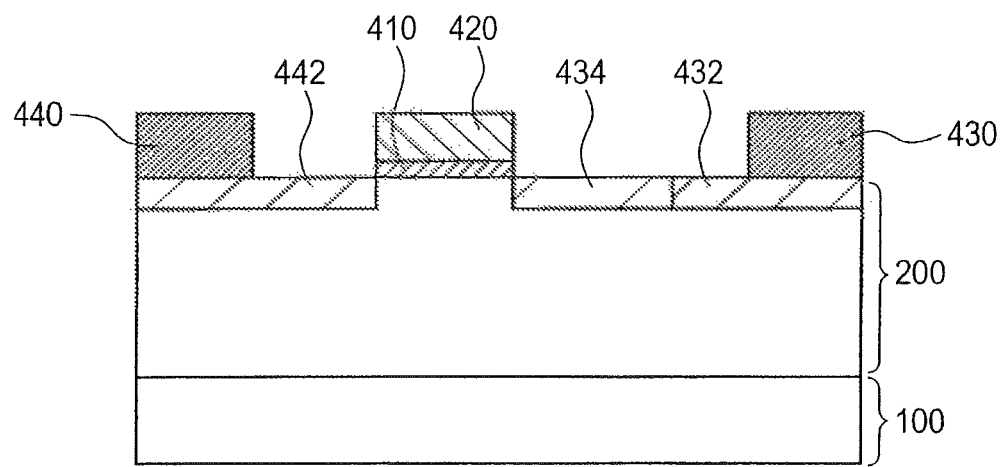
FIG. 7 is a cross-section view showing the structure of a semiconductor device according to a second embodiment.

FIG. 7 is a cross-section view showing the structure of a semiconductor device according to a second embodiment. This semiconductor device is the same as the semiconductor device according to the first embodiment except that a field-effect transistor 10 according to this embodiment is a planar type transistor.

To be precise, a third nitride semiconductor layer 300 is not formed over a second nitride semiconductor layer 200 in this second embodiment. A gate insulating film 410, a drain electrode 430, and a source electrode 440 are formed directly over the second nitride semiconductor layer 200. A gate electrode 420 is formed directly over the gate insulating film 410.

A drain region 432 and a source region 442 are formed on the surface layer of the second nitride semiconductor layer 200. Both drain region 432 and source region 442 are n-type impurity regions. In addition, an extension region 434 is formed between the drain region 432 and the gate region 420 in planar view. The extension region 434 is also an n-type impurity region. However, there is no extension region between the source region 442 and the gate region 420. The drain region 432, the source region 442, and the extension region 434 are formed by implanting impurity ions such as Si ions into the second nitride semiconductor layer 200. By forming the extension region 434, the withstand voltage between the gate electrode 420 and the drain electrode 430 is improved. However, if the withstand voltage between the gate electrode 420 and the drain electrode 430 is not required to be very high, it is all right to replace the extension region 434 with the expanded portion of the drain region 432.

This embodiment also brings about advantageous effects similar to those the first embodiment does. The third nitride semiconductor layer 300 employed by the first embodiment is given distortion to cause the second nitride semiconductor layer 200 to generate the two-dimensional gas 202. Owing to the distortion given to the third nitride semiconductor layer 300, there is a possibility that an inverse piezoelectric effect is generated, and the characteristics of the field-effect transistor 10 are deteriorated. On the other hand, because this embodiment does not have the third nitride semiconductor layer 300, a possibility that the characteristics of the field-effect transistor 10 are deteriorated owing to an inverse piezoelectric effect is very low.

In addition, a concave portion is not formed in this embodiment, which leads to lower production costs.

Third Embodiment

Figure 8:
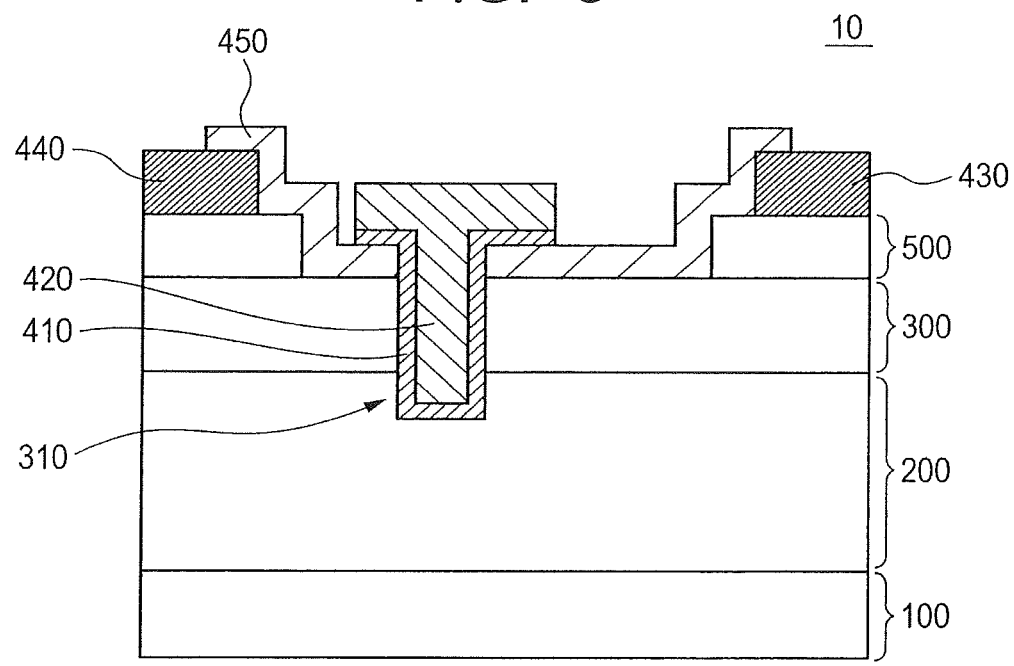
FIG. 8 is a cross-section view of a semiconductor device including a field-effect transistor according to a third embodiment.

FIG. 8 is a cross-section view of a semiconductor device including a field-effect transistor 10 according to a third embodiment. A field-effect transistor 10 according to this embodiment has a structure similar to that the first embodiment has except for the following points described below.

First, this embodiment has a third nitride semiconductor layer 300 that includes n-type impurities. In other words, different from the semiconductor device according to the first embodiment, the semiconductor device according to this embodiment does not use two-dimensional electron gas 202. Therefore, it is not necessary to give distortion to the third nitride semiconductor layer 300.

In addition, fourth nitride semiconductor layers 500 are formed between the third nitride semiconductor layer 300 and a drain electrode 430 and between the third nitride semiconductor layer 300 and a source electrode 440. The fourth nitride semiconductor layers 500 are N-type AlGaN layers, and have an impurity concentration higher than the third nitride semiconductor layer 300 has. It is desirable that the ratio of the Al composition to the Ga composition of the fourth nitride semiconductor layers 500 is similar to that of the third nitride semiconductor layer 300.

In addition, in this embodiment, it is desirable to make the Al composition ratio of the second nitride semiconductor layer 200 equal to the Al composition ratio of the third nitride semiconductor layer 300 in order to reduce the contact resistance between the second nitride semiconductor layer 200 and the third nitride semiconductor layer 300.

This embodiment also brings about advantageous effects similar to those the first embodiment does. In this embodiment, because it is not necessary to give distortion to the third nitride semiconductor layer 300, a possibility that the characteristics of the field-effect transistor 10 is deteriorated owing to an inverse piezoelectric effect is very low in the same way as in the second embodiment.

In addition, when the third nitride semiconductor layer 300 is epitaxially grown, it is possible to implant n-type impurities into the third semiconductor layer 300. Therefore, a processing temperature in this embodiment can be set lower compared with in the second embodiment. In addition, the controllability of the impurity concentration of the third nitride semiconductor layer 300 is higher than the controllability of the impurity concentrations of the drain region 432 and the source region 442 in the second embodiment.

In addition, the fourth nitride semiconductor layers 500 are formed between the third nitride semiconductor layer 300 and the drain electrode 430 and between the third nitride semiconductor layer 300 and the source electrode 440. Owing to the fourth nitride semiconductor layers 500, it is possible to lower the impurity concentration of the third nitride semiconductor layer 300, which makes it possible to increase the withstand voltage of the field-effect transistor 10.

In addition, in this embodiment, if the withstand voltage of the field-effect transistor 10 is not required to be high, it is all right that the fourth nitride semiconductor layers 500 are not formed, and that the impurity concentration of the regions where the fourth nitride semiconductor layers 500 are to be formed can be set to be similar to that of the third nitride semiconductor layer 300.

Fourth Embodiment

Figure 9:
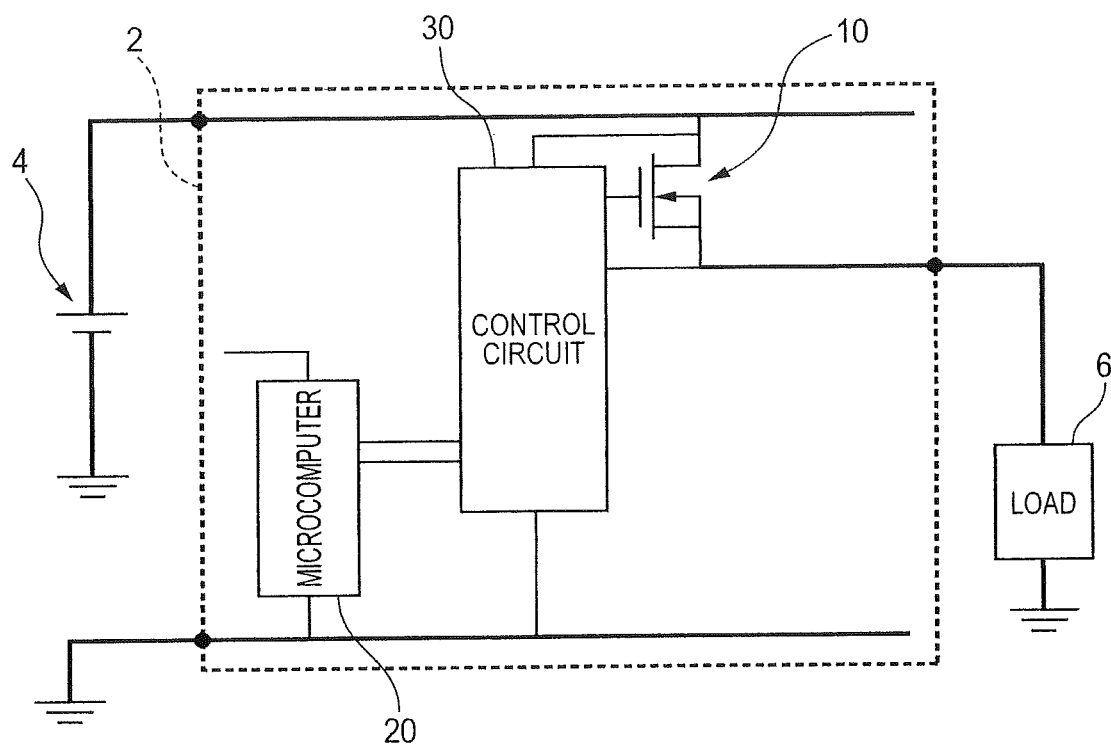
FIG. 9 is a diagram showing a circuit configuration of an electrics apparatus according to a fourth embodiment.

FIG. 9 is a diagram showing a circuit configuration of an electrics apparatus 2 according to a fourth embodiment. This electronics apparatus 2 includes any of the semiconductor devices (that is, the field-effect transistors 10) shown in the first to third embodiments. This electronics apparatus 2 is used for a vehicle, for example, and is coupled to a power supply 4 and a load 6. The power supply 4 is, for example a battery mounted on the vehicle. The load 6 includes, for example, electronics parts mounted on the vehicle such as head lamps, motors that work as motive power sources for power windows and the vehicle. The electronics apparatus 2 controls electric power supplied from the power supply 4 to the load 6.

The electronics apparatus 2 is an electronics apparatus that includes a circuit board (for example, a printed-wiring board), and a semiconductor device having the field-effect transistor 10, a semiconductor device 20, a semiconductor device having a control circuit 30 that are all mounted on the circuit board. The semiconductor device 20 includes a microcomputer, and is coupled to the field-effect transistor 10 via wires on the circuit board. The semiconductor device 20 controls the field-effect transistor 10. To be precise, the semiconductor device 20 sends control signals to the control circuit 30. Thereafter, the control circuit 30 sends signals to the gate electrode 420 of the field-effect transistor 10 in accordance with the control signals sent from the semiconductor device 20. In other words, the control circuit 30 controls the field-effect transistor 10. Electric power is properly provided from the power supply 4 to the load 6 owing to the field-effect transistor 10 controlled by the control circuit 30.

Although the embodiments of the present invention have been described with reference to the accompanying drawings, these embodiments are only illustrative examples, and various modifications other than the above embodiments can be made. Although an AlGaN layer or an AlInN layer has been employed as an example of a nitride semiconductor layer in the above embodiments, a quaternary nitride semiconductor layer can also be employed as long as it satisfies the condition about the polarization described with reference to FIG. 2.

What is claimed is:

1. A semiconductor device, comprising:
a first semiconductor layer;
a second semiconductor layer formed over the first semiconductor layer;
a gate insulating film contacting the second semiconductor layer; and
a gate electrode facing the second semiconductor layer via the gate insulating film,
wherein the first semiconductor layer comprises an $Al_x\alpha_{1-x}N$ layer ($\alpha$ comprises Ga or In, and $0<x<1$), and the second semiconductor layer comprises an $Al_y\alpha_{1-y}N$ layer ($0\leq y<1$),
wherein y of the $Al_y\alpha_{1-y}N$ layer forming the second semiconductor layer increases at least in a region under the gate electrode as a position where y is measured approaches the first semiconductor layer
wherein the second semiconductor layer is formed by stacking a plurality of semiconductor layers,
wherein an Al composition ratio of the second semiconductor layer changes stepwise, and
wherein, when y of $Al_y\alpha_{1-y}N$ layer at an interface between the first semiconductor layer and the second semiconductor layer is y1, and y of $Al_y\alpha_{1-y}N$ layer at an interface between the second semiconductor layer and a third semiconductor layer is y2, there is a relationship "$0.05<y1-y2<0.12$" between y1 and y2.

2. The semiconductor device according to claim 1, further comprising:
a source electrode and a drain electrode formed over the second semiconductor layer.

3. The semiconductor device according to claim 1, wherein the plurality of semiconductor layers are polarized in a same direction at least in a region under the gate electrode, and have compositions different from each other, such that an amount of negative charge is larger than an amount of a positive charge at each interface between two of the plurality of semiconductor layers.

4. The semiconductor device according to claim 1, wherein, at an interface between the first semiconductor layer and the second semiconductor layer, there is a relationship "$x=y$" between x of the $Al_x\alpha_{1-x}N$ layer forming the first semiconductor and y of the $Al_y\alpha_{1-y}N$ layer forming the second semiconductor layer.

5. A semiconductor device, comprising:
a first semiconductor layer;
a second semiconductor layer formed over the first semiconductor layer;
a third semiconductor layer that is formed over the second semiconductor layer;
a concave portion that is formed in the third semiconductor layer, a lower end of the concave portion reaching the second semiconductor layer and not reaching the first semiconductor layer;
a gate insulating film formed on a bottom and a lateral side of the concave portion; and
a gate electrode embedded in the concave portion,
wherein the first semiconductor layer comprises an $Al_x\alpha_{1-x}N$ layer ($\alpha$ comprises Ga or In, and $0<x<1$), the second semiconductor layer comprises an $Al_y\alpha_{1-y}N$ layer ($0\leq y<1$), and the third semiconductor layer comprises an $Al_z\alpha_{1-z}N$ layer ($0\leq z<1$),
wherein y of the $Al_y\alpha_{1-y}N$ layer forming the second semiconductor layer increases at least in a region under the gate electrode as a position where y is measured approaches the first semiconductor layer, and
wherein, at an interface between the second semiconductor layer and the third semiconductor layer, there is a relationship "$z>y$" between z of the $Al_z\alpha_{1-z}N$ layer forming the third semiconductor layer and y of the $Al_y\alpha_{1-y}N$ layer forming the second semiconductor layer.

6. The semiconductor device according to claim 5, wherein the second semiconductor layer is formed by stacking a plurality of semiconductor layers.

7. The semiconductor device according to claim 6, wherein an Al composition ratio of the second semiconductor layer changes stepwise.

8. The semiconductor device according to claim 6, wherein an Al composition ratio of the second semiconductor layer changes discontinuously.

9. The semiconductor device according to claim 5, further comprising:
a source electrode and a drain electrode formed over the third semiconductor layer.

10. The semiconductor device according to claim 5, wherein, at the interface between the second semiconductor layer and the third semiconductor layer, there is a relationship "z>y+0.05" between z and y.

11. The semiconductor device according to claim 5, wherein, at the interface between the second semiconductor layer and the third semiconductor layer, there is a relationship "z>y+0.1" between z and y.

12. The semiconductor device according to claim 5, wherein, at an interface between the first semiconductor layer and the second semiconductor layer, there is a relationship "x=y" between x of the $Al_x\alpha_{1-x}N$ layer forming the first semiconductor and y of the $Al_y\alpha_{1-y}N$ layer forming the second semiconductor layer.

13. The semiconductor device according to claim 5, wherein, when y of $Al_y\alpha_{1-y}N$ layer at an interface between the first semiconductor and the second semiconductor is y1, and y of $Al_y\alpha_{1-y}N$ layer at an interface between the second semiconductor and the third semiconductor is y2, there is a relationship "0.05<y1-y2<0.12" between y1 and y2.

14. The semiconductor device according to claim 5, wherein the second semiconductor layer is formed by stacking a plurality of semiconductor layers, and the plurality of semiconductor layers are polarized in a same direction at least in a region under the gate electrode, and have compositions different from each other, such that an amount of negative charge is larger than an amount of a positive charge at each interface between two of the plurality of semiconductor layers.

* * * * *